(12) United States Patent
Lee et al.

(10) Patent No.: US 8,080,926 B2
(45) Date of Patent: Dec. 20, 2011

(54) MULTI-DISPLAY APPARATUS AND METHOD OF MANUFACTURING THE SAME

(75) Inventors: Young-gu Lee, Gyeonggi-do (KR); In-seo Kee, Gyeonggi-do (KR); Hong-shik Shim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 1064 days.

(21) Appl. No.: 11/739,439

(22) Filed: Apr. 24, 2007

(65) Prior Publication Data

US 2008/0074344 A1 Mar. 27, 2008

(30) Foreign Application Priority Data

Sep. 25, 2006 (KR) .................... 10-2006-0092923

(51) Int. Cl.
*H01J 61/94* (2006.01)
(52) U.S. Cl. ................ 313/1; 445/24; 313/504
(58) Field of Classification Search .............. 313/1, 512; 445/24
See application file for complete search history.

(56) References Cited

U.S. PATENT DOCUMENTS

| | | |
|---|---|---|
| 4,408,836 A | 10/1983 | Kikuno |
| 5,801,797 A | 9/1998 | Iida et al. |
| 5,903,328 A | 5/1999 | Greene et al. |
| 7,489,286 B2 * | 2/2009 | Kawase et al. ............... 345/1.1 |
| 2002/0048438 A1 * | 4/2002 | Veligdan ....................... 385/120 |
| 2004/0014252 A1 | 1/2004 | Shimoda et al. |
| 2004/0256977 A1 | 12/2004 | Aston |
| 2005/0020175 A1 * | 1/2005 | Tamashiro et al. ............. 445/24 |
| 2005/0285811 A1 * | 12/2005 | Kawase et al. ............... 345/1.1 |
| 2007/0001927 A1 * | 1/2007 | Ricks et al. ................... 345/1.1 |
| 2008/0037284 A1 * | 2/2008 | Rudisill ....................... 362/629 |

OTHER PUBLICATIONS

European Patent Office Office Action; Jan. 2, 2008; 07117199.5-1228.
Chinese Office Action with English Translation for Application No. 200710194403.4 dated Jul. 27, 2011.

* cited by examiner

*Primary Examiner* — Peter Macchiarolo
(74) *Attorney, Agent, or Firm* — Cantor Colburn LLP

(57) ABSTRACT

Provided are a multi-display apparatus and a method of manufacturing the multi-display apparatus. The method includes preparing a pair of unit panels respectively comprising display devices, etching main bodies of the pair of unit panels, and connecting the pair of unit panels so that etched portions of the main bodies of the unit panels overlap in a thickness direction of the unit panels.

14 Claims, 8 Drawing Sheets

MULTI-DISPLAY APPARATUS AND METHOD OF MANUFACTURING THE SAME

This application claims priority to Korean Patent Application No. 10-2006-0092923, filed on Sep. 25, 2006, and all the benefits accruing therefrom under 35 U.S.C. 119, the contents of which are herein incorporated by reference in its entirety.

BACKGROUND OF THE INVENTION

1. Field of the Invention

The present invention relates generally to a multi-display apparatus and method of manufacturing the same. More particularly, the present invention relates to a multi-display apparatus that minimizes image disconnection at seams of display panels incorporated therein, and a method of manufacturing the multi-display apparatus.

2. Description of the Related Art

Generally, large-screen multi-display apparatuses are implemented by connecting a plurality of display panels. In the past, large screens were realized by inter-connecting a plurality of numbers of Braun® tubes into a large television. However, recently, due to the increasing demand for large screens in small mobile apparatuses, such as mobile phones or personal digital assistants ("PDAs"), larger screens are being produced by inter-connecting flat panel displays such as liquid crystal displays ("LCDs"), field emission displays ("FEDs"), plasma display panels ("PDPs"), and organic light-emitting diodes ("LEDs").

Conventionally, multi-display apparatuses are manufactured by connecting unit panels 10 in parallel, as depicted in FIG. 1. That is, a multi-screen is realized by connecting the plurality of the unit panels 10 in parallel as depicted in FIG. 1. However, an image at a seam between a pair of unit panels 10 is not smoothly formed when the pair of unit panels 10 is connected in parallel, as the pair of unit panels 10 becomes frequently disconnected at the seam between the pair of unit panels 10. As schematically depicted in FIG. 1, a flat panel display has a sealing structure in which a display device 12 that forms a pixel is mounted on a substrate glass 11 and a cover glass 13 covering the display device 12 is attached to the substrate glass 11. As such, the cover glass 13 basically has a rim thickness t and the display device 12 is located on an inner portion of the cover glass 13. Therefore, an image separation of as much as a disconnection distance w occurs at the seam between the pair of display devices 12. The distance w cannot be reduced since the distance w is inevitably required for the cover glass 13 to cover the display devices 12 to protect the display devices 12. Therefore, there is a limitation in improving the image disconnection at the seam between the pair of unit panels 10 in the above parallel connection structure.

One attempt to overcome this problem involves a structure as will now be described in FIG. 2. The structure includes two substrates 21a and 22a formed on respectively first and second unit panels 21 and 22, and cover glass 21c and 22c disposed over respective pixels 21b and 22b. The pair of first and second unit panels 21 and 22 is disposed with a step difference, and pixel boundaries between the pair of first and second unit panels 21 and 22 are vertically aligned along line L, as shown, e.g., in FIG. 2. That is, after the pair of first and second unit panels 21 and 22 are disposed with the step difference as depicted in FIG. 2, a right side boundary surface of the pixel 21b of the first unit panel 21 is aligned to a left side boundary surface of the pixel 22b of the second unit panel along vertical line L. In such form, the image disconnection at a seam between the pair of first and second unit panels 21 and 22 is minimized when the image is seen from above the pair of first and second unit panels 21 and 22. The multi-display apparatus of FIG. 2 includes a transparent plate 23 mounted on the second panel 22 to match upper surfaces of the two unit panels 21 and 22.

However, while the configuration shown in FIG. 2 provides some measure of image connection, the step difference between the two unit panels 21 and 22 result in a greater thickness of the overall structure. Considering that the recent trend is to pursue lightweight and slim display products, the increased product thickness of the multi-display apparatus is not typically a desirable feature and may have a negative impact on competition of multi-display products in the market. Furthermore, the multi-display apparatuses as described above are typically manufactured in a folder type structure in which a pair of panels is connected with a hinge for mobile convenience. That is, when a multi-display apparatus is carried, the pair of panels is folded, but when the multi-display apparatus is used, the two panels are unfolded into one screen as depicted in FIGS. 1 and 2. As a result of this configuration, an air gap G between the pair of panels, as depicted in FIG. 3, occurs even when a structural tolerance between the pair of panels is well matched when the stack layer type structure as depicted in FIG. 2 is manufactured. Accordingly, the thickness of multi-display products increases.

Accordingly, to ensure product competitiveness, there is a need for a multi-display apparatus that can mitigate the image disconnection at a seam between panels of the multi-display apparatus without increasing the thickness of the panels of the multi-display apparatus.

BRIEF SUMMARY OF THE INVENTION

Exemplary embodiments of the present invention include a multi-display apparatus with improved image connection at a seam of panels without increasing the thickness thereof, and a method of manufacturing the multi-display apparatus.

According to an aspect of the present invention, there is provided a method of manufacturing a multi-display apparatus. The method includes preparing a pair of unit panels respectively comprising display devices; etching main bodies of the pair of unit panels; and connecting the pair of unit panels so that etched portions of the main bodies of the unit panels overlap in a thickness direction of the unit panels.

The preparation of the pair of unit panels may include, after stacking the display devices in parallel on a substrate and covering the two display devices using a cover having a separation wall, separating the pair of unit panels by cutting along the separation wall. The etching of the main bodies of the pair of unit panels may include forming etch portions to be overlapped in the thickness direction by etching the main bodies of the separated pair of unit panels.

Alternatively, the preparation of the pair of unit panels may include stacking the display devices in parallel on a substrate and covering the display devices using a cover having a separation wall. The etching of the main bodies of the pair of unit panels may include forming etch portions to be overlapped in the thickness direction by etching the main bodies of the pair of unit panels prior to separating the pair of unit panels. The connecting of the pair of unit panels may include, after the etched main bodies are separated into the pair of unit panels by cutting along the separation wall, connecting the main bodies of the pair of the unit panels to overlap in the thickness direction.

The method may further comprise forming an optical film on a surface of one of the unit panels such that upper surfaces of the pair of unit panels are horizontally aligned.

According to another aspect of the present invention, there is provided a multi-display apparatus including a pair of unit panels. Each of the unit panels includes a display device a main body. The unit panels overlap, and connect to, one another at etched portions of respective main bodies thereof in a thickness direction of the unit panels.

The multi-display apparatus may further include an optical film formed on a surface of one of the unit panels such that upper surfaces of the pair of unit panels are horizontally aligned.

BRIEF DESCRIPTION OF THE DRAWINGS

The above and other aspects, features, and advantages of the present invention will become more apparent by describing in detail exemplary embodiments thereof with reference to the attached drawings in which.

DETAILED DESCRIPTION OF THE INVENTION

Figure 1:
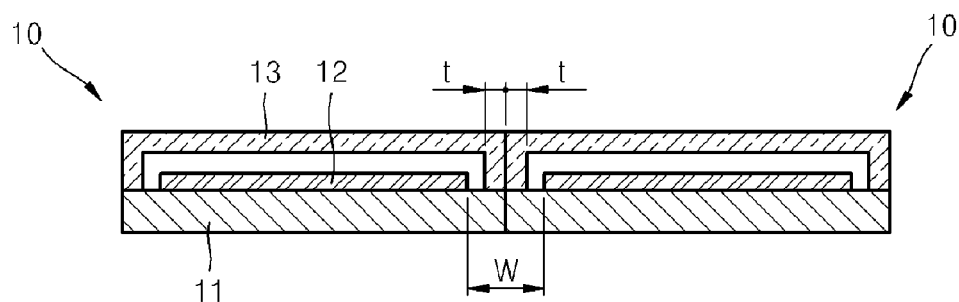
FIG. 1 is a cross-sectional view illustrating a conventional multi-display apparatus.

Reference will now be made in detail to exemplary embodiments of the present invention, examples of which are illustrated in the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art.

A same reference number is allocated to a same element for different embodiments. The same element may be representatively explained only in a first embodiment and omitted in subsequent embodiments.

If a first film (layer) or element is 'on' a second film (layer) or element, third films (layers) or elements may be interposed between the first and the second films (layers) or elements or the first and the second films (layers) or elements may contact directly. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

Figure 4:
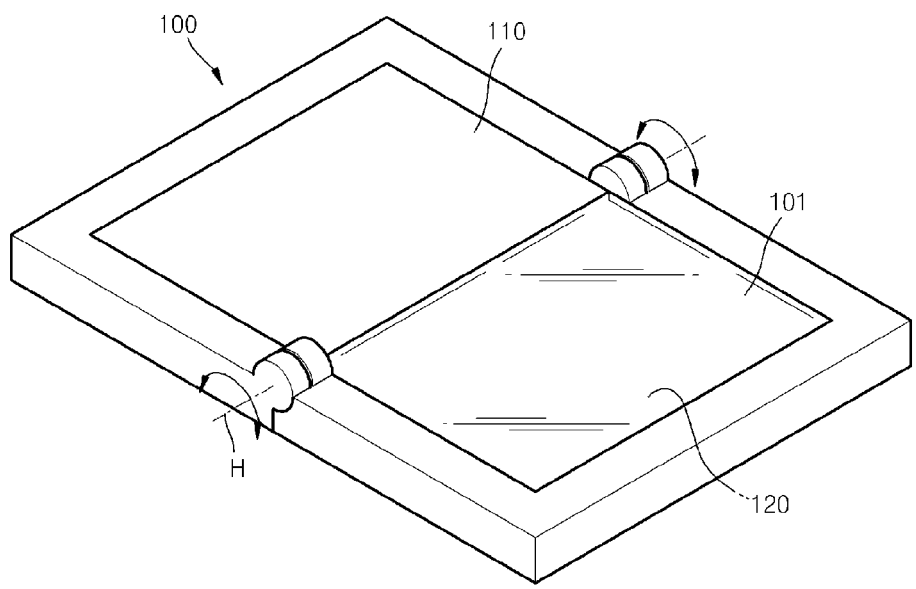
FIG. 4 is a perspective view illustrating a multi-display apparatus according to an exemplary embodiment of the present invention.
Figure 5:
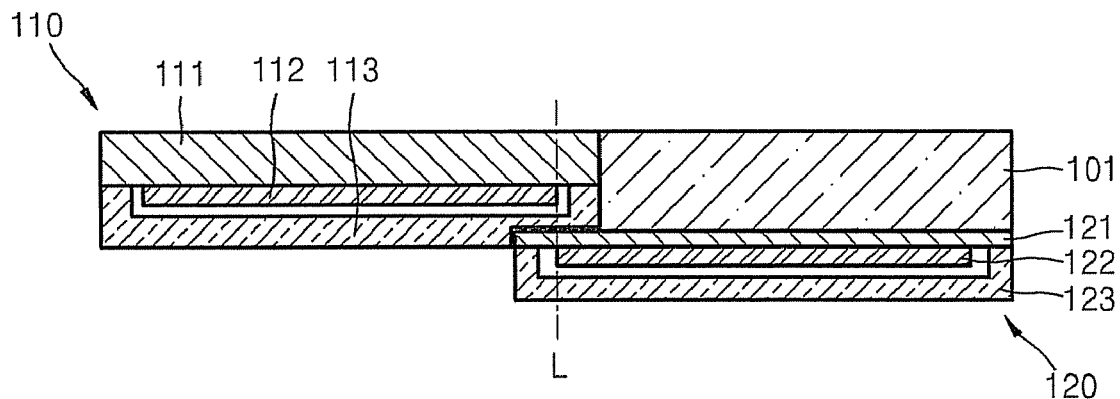
FIG. 5 is a cross-sectional view illustrating a connection structure of unit panels in the multi-display apparatus of FIG. 4, according to an exemplary embodiment of the present invention.

FIG. 4 is a perspective view illustrating a multi-display apparatus 100 according to an exemplary embodiment of the present invention. FIG. 5 is a cross-sectional view illustrating an exemplary connection structure of unit panels 110 and 120 in the multi-display apparatus 100 of FIG. 4. Although the multi-display apparatus 100 can be made by connecting a plurality of panels in various ways, in the present embodiment, for convenience of description, connection of pair of unit panels 110 and 120 will be described.

As depicted in FIG. 5, each of the unit panels 110 and 120 has a main body structure in which a pair of display devices 112 and 122 that display images are respectively stacked on substrates 111 and 121, and covers 113 and 123 that surround the display devices 112 and 122 are attached to the respective substrates 111 and 121. If the unit panels 110 and 120 are a top emission type, images formed by the display devices 112 and 122 are displayed through the covers 113 and 123, and if the unit panels 110 and 120 are a bottom emission type, the images are displayed through the substrates 111 and 121. In the present embodiment, a bottom emission type is described for purposes of illustration.

As depicted in FIG. 4, the pair of unit panels 110 and 120 form a multi-image by being connected in a folder type of connection in which the unit panels 110 and 120 can be folded and unfolded with respect to a hinge axis H. The pair of unit panels 110 and 120 is configured with a step difference as depicted in FIG. 5 when the pair of unit panels 110 and 120 is unfolded. That is, when the structure 100 is unfolded, the unit panel 120 extends lower than the unit panel 110 when viewed from a cross-section position. As described above, the multi-display apparatus 100 is a structure in which boundaries of the display devices 112 and 122 are vertically aligned along line L so the image appears to be connected (e.g., seamless) when viewed from above the seam.

Figure 2:
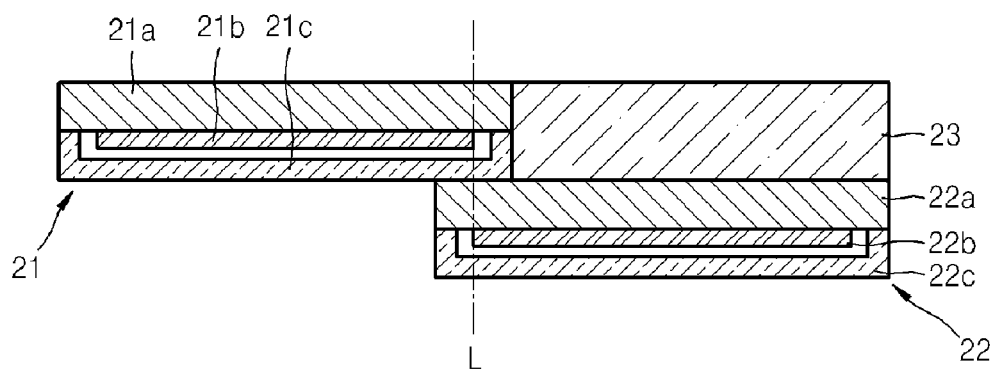
FIG. 2 is a cross-sectional view illustrating another conventional multi-display apparatus.
Figure 3:
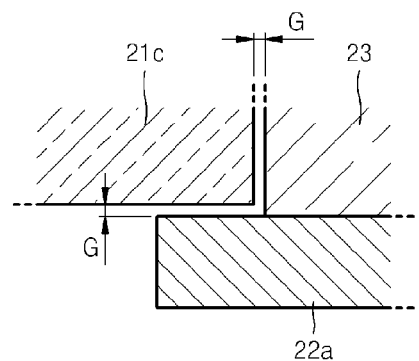
FIG. 3 is an enlarged cross-sectional view illustrating an air gap formed between unit panels of the conventional multi-display apparatus of FIG. 2.

In the present embodiment, not only do the pair of unit panels 110 and 120 overlap in order to connect the display devices 112 and 122, but also portions of the main bodies of the pair of unit panels 110 and 120 overlap in a thickness direction of the unit panels 110 and 120. That is, as described with reference to FIG. 2, in the prior art, since only a pair of panels 21 and 22 are disposed with a step difference, the thickness of a conventional multi-display apparatus increases to more than double (i.e., in accordance with the thickness of each unit panel) as compared to when the pair of panels 21 and 22 is disposed in parallel side by side as illustrated in FIG. 1. However, in the present embodiment as shown in FIG. 5, the main bodies of the pair of unit panels 110 and 120 overlap in the thickness direction of the unit panels 110 and 120, thereby reducing the overall thickness of the product. As shown in FIG. 5, a lower surface of substrate 121 is horizontally aligned with a lower surface of the cover 113 of substrate 111, and a portion of the substrate 121 is disposed in a corresponding etched portion of the cover 113. Further, as shown in FIG. 5, an optical film 101 is disposed on the substrate 121 and has a thickness such that the upper surfaces of the two unit panels 110 and 120 are horizontally aligned.

Figure 6A:
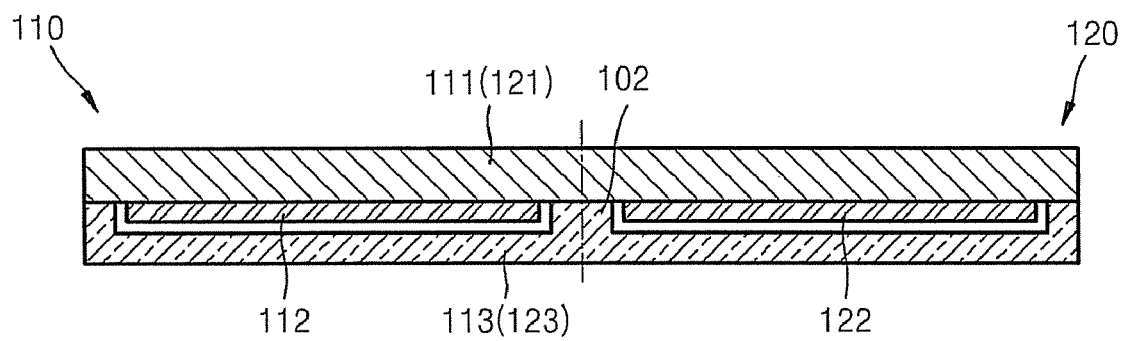
FIGS. 6A through 6E are cross-sectional views illustrating a method of manufacturing the multi-display apparatus of FIG. 4, according to an exemplary embodiment of the present invention.
Figure 6B:
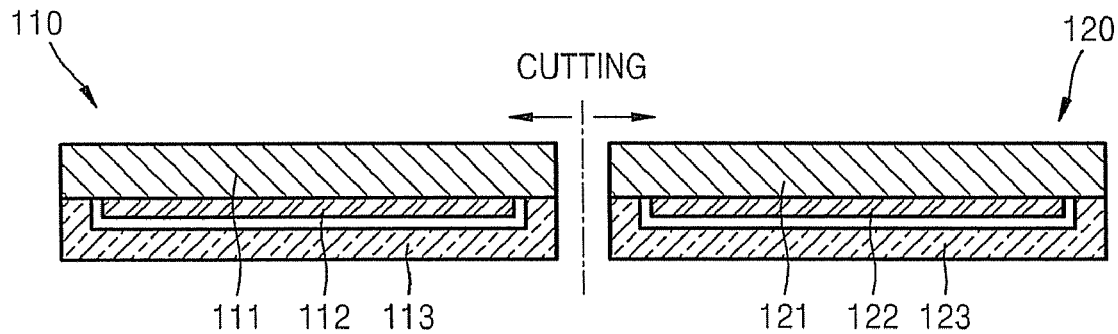
Figure 6C:
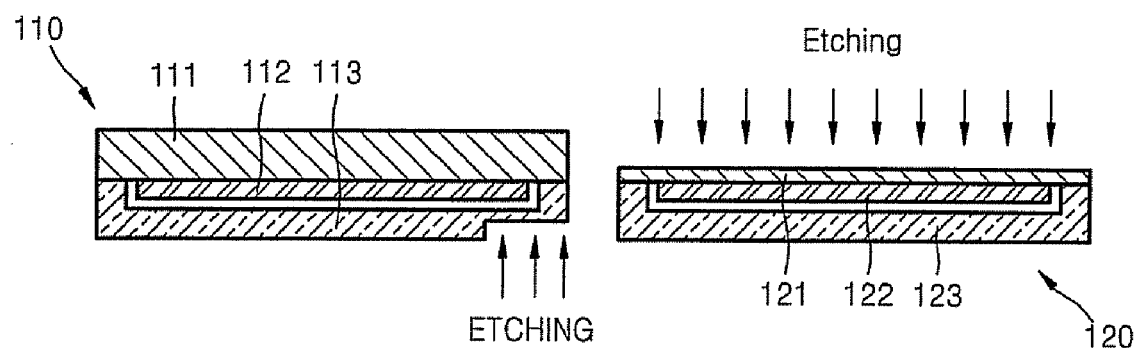
Figure 6D:
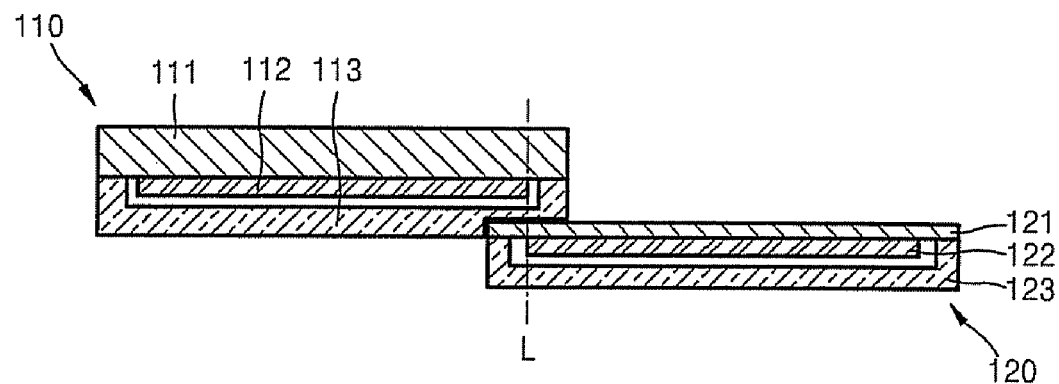
Figure 6E:
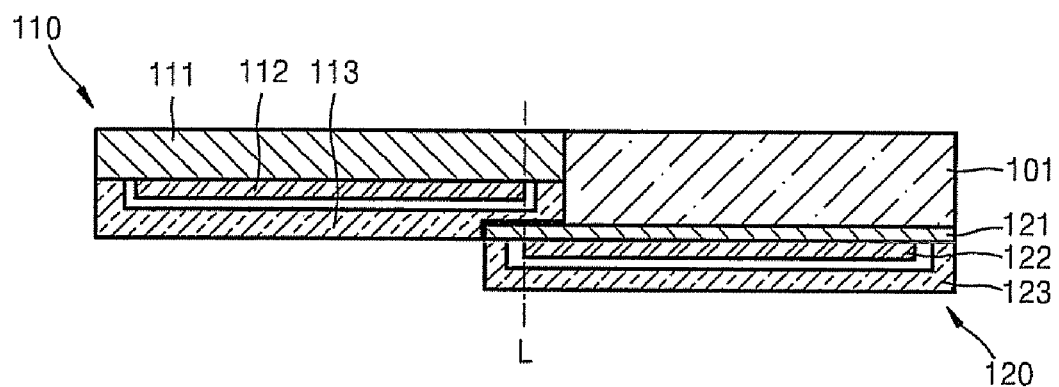

A method of manufacturing the multi-display apparatus 100 having the above structure will now be described with reference to FIGS. 6A through 6E. FIGS. 6A through 6E are cross-sectional views illustrating a method of manufacturing the multi-display apparatus 100 of FIG. 4, according to an exemplary embodiment of the present invention;

Referring to FIG. 6A, the pair of unit panels 110 and 120 that cover the pair of parallel display devices 112 and 122 stacked on the substrates 111 and 121 and the covers 113 and 123 having a separation wall 102 are prepared. Referring to FIG. 6B, the pair of unit panels 110 and 120 is separated by cutting the substrates 111 and 121 and the covers 113 and 123 along the center line of the separation wall 102. In this state, etching units are formed to overlap in terms of the pair of unit panels 110 and 120 by etching the main bodies of the unit panels 110 and 120. That is, a portion of the cover 113 of the unit panel 110 is etched and the entire upper surface of the substrate 121 of the unit panel 120 is etched as depicted in FIG. 6C. Next, as depicted in FIG. 6D, when the pair of unit panels 110 and 120 are disposed to overlap at respective etched portions thereof, not only are the pair of display devices 112 and 122 of the unit panels 110 and 120 connected but also the main bodies of the pair of unit panels 110 and 120 overlap, thereby reducing the thickness of the multi-display apparatus 100 by the measure of the overlap, as compared to the prior art. In the present embodiment, a folding type of connection is described as an example, however, when the pair of unit panels 110 and 120 are unfolded, the pair of unit panels 110 and 120 can be coupled using a hinge to allow the pair of unit panels to be unfolded as depicted in FIG. 6D. Therefore, the image disconnection at a seam between the pair of unit panels 110 and 120 can be improved and the problem of increasing the thickness of the multi-display apparatus 100 can also be solved. In FIG. 6E, an optical film 101 is formed on the substrate 121 of the unit panel 110 having a thickness formed to correspond to the height difference between the pair of unit panels 110 and 120. In other words, an upper surface of the unit panel 120 is horizontally aligned with an upper surface of unit panel 110.

Figure 7A:
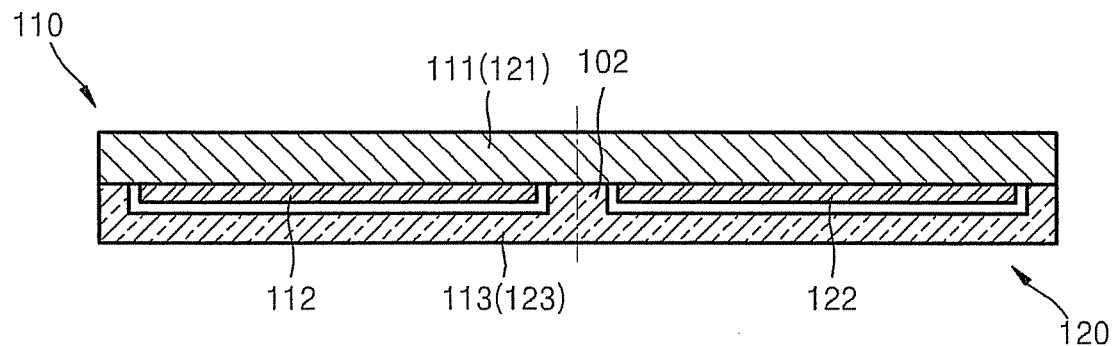
FIGS. 7A through 7D are cross-sectional view illustrating a method of manufacturing the multi-display apparatus of FIG. 4, according to another exemplary embodiment of the present invention.
Figure 7B:
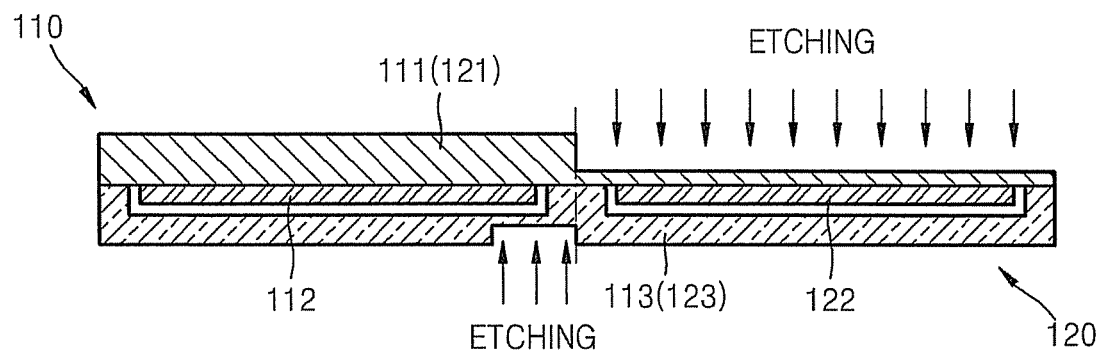
Figure 7C:
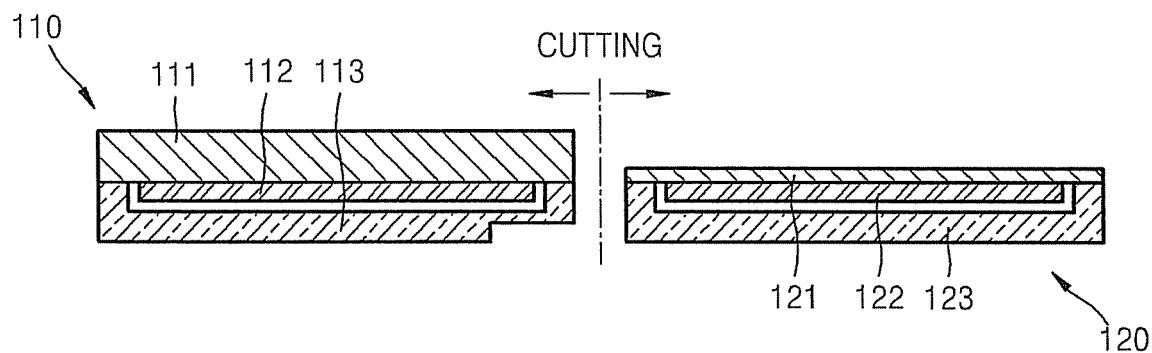
Figure 7D:
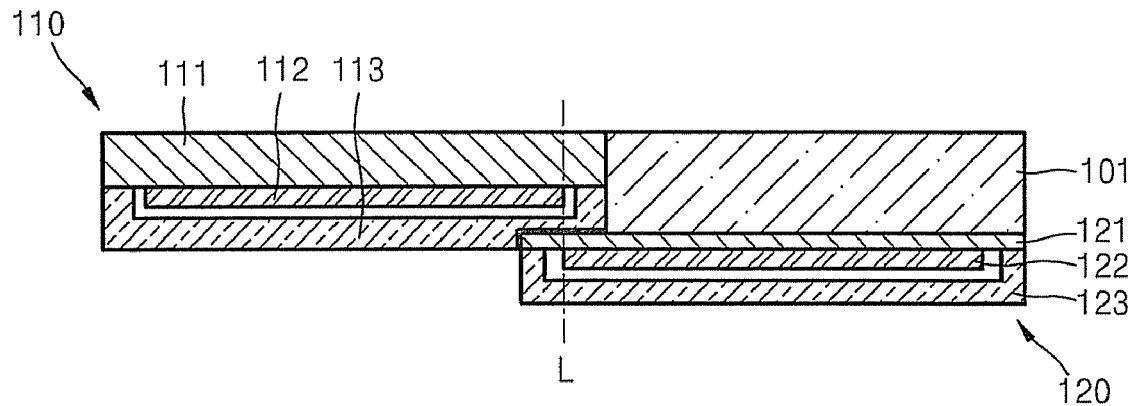

In the foregoing description, the etchings may be performed on each of the unit panels 110 and 120 after separating the pair of unit panels 110 and 120 by cutting. However, the etchings on the unit panels 110 and 120 can be performed prior to separating the unit panels 110 and 120. FIGS. 7A through 7D illustrate a method of manufacturing the multi-display apparatus 100 of FIG. 4, according to another exemplary embodiment of the present invention, in which the etching is performed prior to separating the substrates. The preparation of the unit panels 110 and 120 prior to separating as shown in FIG. 7A is the same as the foregoing description as illustrated in FIG. 6A. However, the pair of unit panels 110 and 120 is not directly cut at this point, but as depicted in FIG. 7B, a portion of the cover 113 of the unit panel 110 and the entire surface of a substrate 111 of the unit panel 120 are etched. Afterwards, as depicted in FIG. 7C, the pair of unit panels 110 and 120 are separated by cutting, and as depicted in FIG. 7D, the pair of unit panels 110 and 120 are connected and an optical film 101 is formed on the substrate 121 of the unit panel 120, and thereby completing the manufacture of the multi-display apparatus 100 as described above.

Alternately, a method of overlapping the pair of unit panels 110 and 120 in a thickness direction of the unit panels 110 and 120, in which the entire surface portion of a substrate 111 of the unit panel 110 is etched and a portion of the cover 113 of the unit panel 120 is etched, can be applied.

Figure 8A:
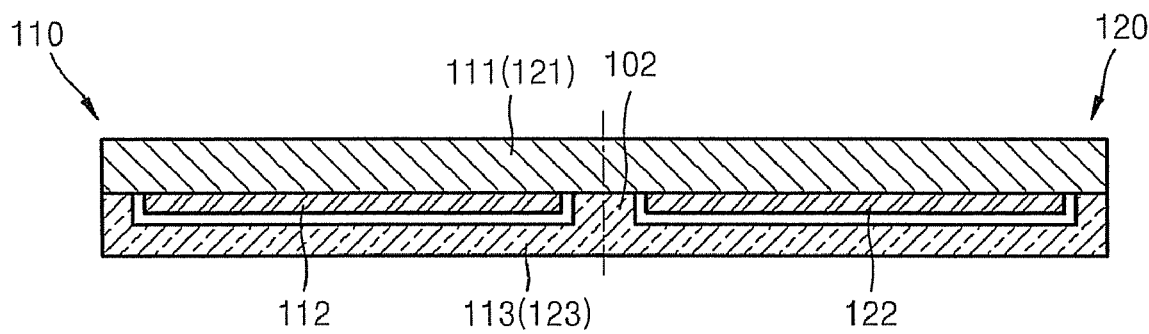
FIGS. 8A through 8D are cross-sectional view illustrating a method of manufacturing a multi-display apparatus according to another exemplary embodiment of the present invention.
Figure 8B:
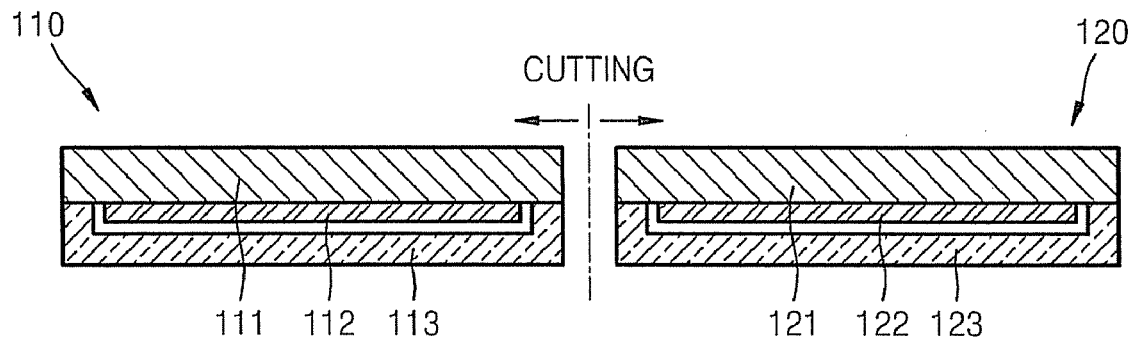
Figure 8C:
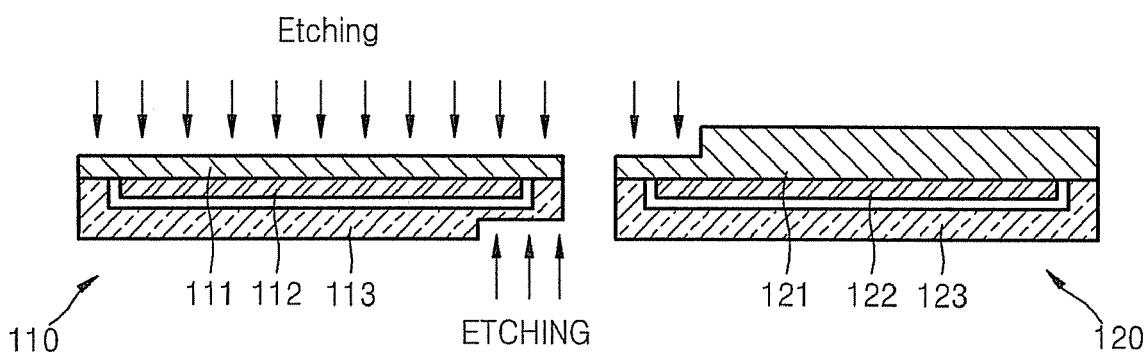
Figure 8D:
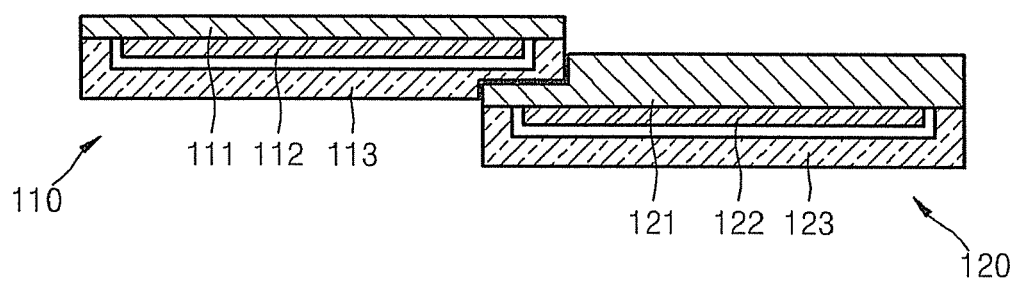

FIGS. 8A through 8D are cross-sectional views illustrating a method of manufacturing a multi-display apparatus according to another exemplary embodiment of the present invention. Referring to FIGS. 8A through 8D, the substrates 111 and 121 and the pair of unit panels 110 and 120 covered by covers 113 and 123 are prepared (FIG. 8A). Then, the pair of unit panels 110 and 120 is separated by cutting (FIG. 8B), and the entire upper surface of the substrate 111 and a lower portion of the cover 113 of the unit panel 110 and an upper portion of the substrate 121 of the unit panel 120 are etched using an etching process (FIG. 8C). Next, the main bodies of the pair of unit panels 110 and 120 overlap with respect to the etched portions of the lower portion of the cover 113 and the upper portion of substrate 121. The basic processes may be the same as previously described embodiments; however, in the present embodiment, since the substrate 111 of the unit panel 110 disposed on an upper side of the unit panel 110 is etched, the height difference between the pair of unit panels 110 and 120 is relatively small. Accordingly, the height difference between unit panels 110 and 120 does not pose any issues with respect to image quality. Of course, it will be understood that the optical film 101 may be formed on the substrate 121 in a manner similar to that described above.

Also, the method of manufacturing the multi-display apparatus 100 described with reference to FIGS. 8A through 8D can also be modified such that an etching may be performed prior to separating unit panels 110 and 120 as described with reference to FIGS. 7A through 7D.

FIGS. 9A through 9D are cross-sectional views illustrating a method of manufacturing a multi-display apparatus according to another exemplary embodiment of the present invention.

Figure 9A:
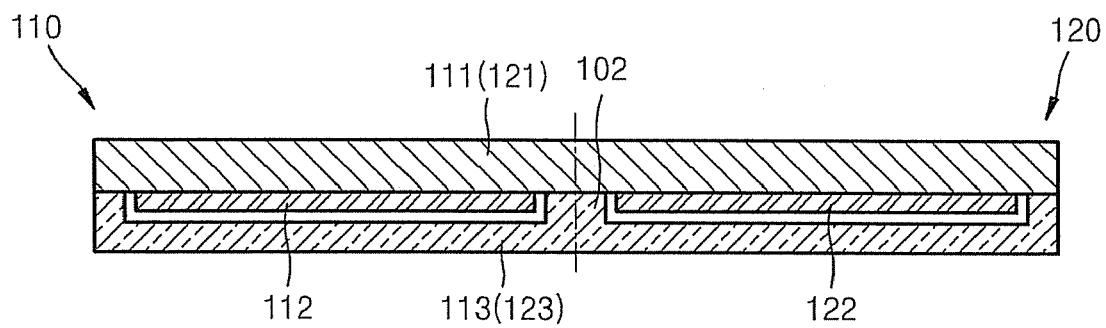
FIGS. 9A through 9D are cross-sectional view illustrating a method of manufacturing a multi-display apparatus according to another exemplary embodiment of the present invention.
Figure 9B:
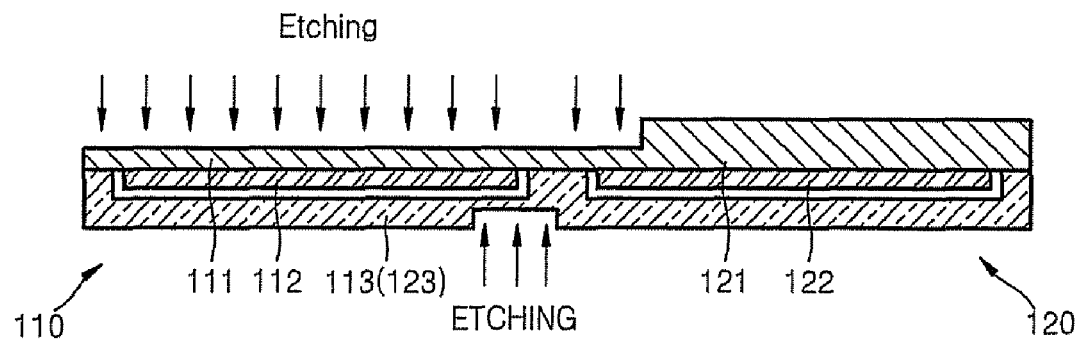
Figure 9C:
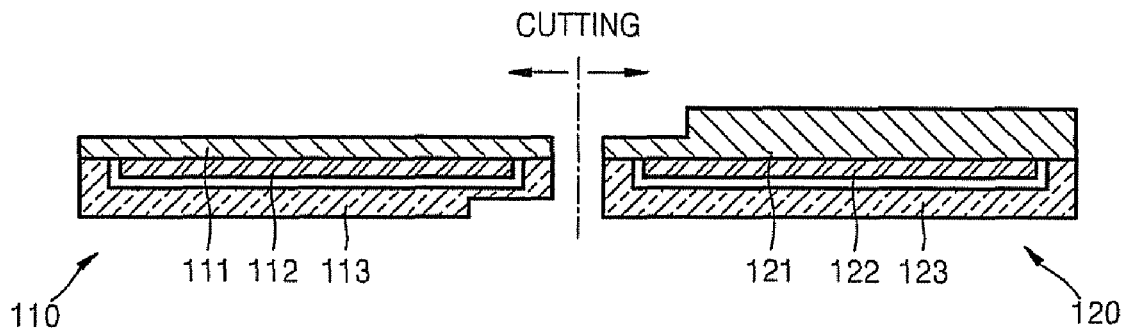
Figure 9D:
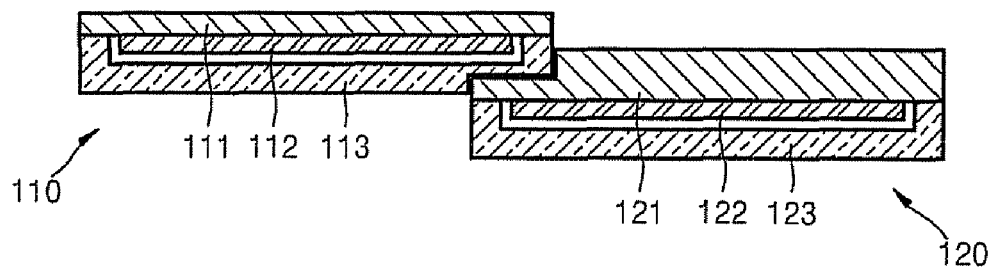

Referring to FIGS. 9A through 9D, the substrates 111 and 121 and the pair of unit panels 110 and 120 covered by the covers 113 and 123 are prepared (FIG. 9A), and the entire upper surface of the substrate 111 and a lower portion of the cover 113 of the unit panel 110 and an upper portion of the substrate 121 of the unit panel 120 are etched using an etching process (FIG. 9B). Afterwards, the etched panel is separated into the pair of unit panels 110 and 120 by cutting (FIG. 9C), e.g., along a center line thereof, and the pair of unit panels 110 and 120 are connected (FIG. 9D). Thus, the manufacture of the multi-display apparatus 100 according to the present embodiment is completed.

Accordingly, when a multi-display apparatus is manufactured by connecting the pair of unit panels 110 and 120 using the above described methods, the image disconnection at a seam between the pair of unit panels 110 and 120 can be improved by connecting the display devices 112 and 122, and the thickness of the multi-display apparatus 100 can be reduced. Therefore, it is advantageous for product slimness.

The display devices 112 and 122 may include various flat panel display devices such as liquid crystal displays ("LCDs"), field emission displays ("FEDs"), plasma display panels ("PDPs"), and organic light-emitting diodes ("OLEDs").

The multi-display apparatus and methods of manufacturing the multi-display apparatus described above according to the present invention improve image disconnection at a seam between unit panels thereof and reduce the thickness of the multi-display apparatus, thereby resulting in a slim and high quality multi-display apparatus.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a multi-display apparatus comprising:
    preparing a pair of unit panels respectively comprising first and second display devices;
    etching main bodies of the pair of unit panels; and
    connecting the pair of unit panels in a width and in a thickness direction so that etched portions of the main bodies of the unit panels overlap in the thickness direction of the unit panels, wherein an edge of the first display device is vertically aligned with an edge of the second display device.

2. The method of claim 1, wherein preparation of the pair of unit panels comprises, after stacking the display devices in parallel on a substrate and covering the display devices using a cover having a separation wall, separating the pair of unit panels by cutting along the separation wall; and
    wherein etching the main bodies of the pair of unit panels comprises forming etch portions to be overlapped in the thickness direction by etching the main bodies of the separated pair of unit panels.

3. The method of claim 1, wherein preparation of the pair of unit panels comprises stacking the display devices in parallel on a substrate and covering the display devices using a cover having a separation wall; and
    wherein etching the main bodies of the pair of unit panels comprises forming etch portions to be overlapped in the thickness direction by etching the main bodies of the pair of unit panels prior to separating the pair of unit panels; and
    wherein connecting the pair of unit panels comprises, after the etched main bodies are separated into the pair of unit panels by cutting along the separation wall, connecting the main bodies of the pair of unit panels to overlap in the thickness direction.

4. The method of claim 1, further comprising forming an optical film on a surface of one of the unit panels such that upper surfaces of the pair of unit panels are horizontally aligned.

5. The method of claim 1, wherein a cover of a first unit panel of the pair of unit panels and a substrate of a second unit panel of the pair of unit panels overlap in the width direction.

6. The method of claim 5, wherein the width direction is substantially perpendicular to the thickness direction.

7. The method of claim 1, wherein the etching further comprises etching an entire upper surface of a substrate of a first unit panel of the pair of unit panels.

8. The method of claim 1, wherein the etching further comprises etching a portion of a second unit panel of the pair of unit panels.

9. The method of claim 1, wherein the preparing of the pair of unit panels comprises cutting along a separation wall to separate the pair of unit panels.

10. The method of claim 1, wherein a distance in the width direction between the first display device and the second display device is substantially zero.

11. A multi-display apparatus, comprising:
    a pair of unit panels respectively comprising a first display device and a second display device, the unit panels including main bodies,
    wherein the unit panels overlap and connect to one another in a width and in a thickness direction of the unit panels, and
    wherein an edge of the first display device is vertically aligned with an edge of the second display device.

12. The multi-display apparatus of claim 11, further comprising an optical film formed on a surface of one of the unit panels such that upper surfaces of the pair of unit panels are horizontally aligned.

13. The multi-display apparatus of claim 11, wherein a cover of a first unit panel of the pair of unit panels and a substrate of a second unit panel of the pair of unit panels overlap in the width direction.

14. The multi-display apparatus of claim 11, wherein a distance in the width direction between the first display device and the second display device is substantially zero.

* * * * *